US010871682B2

(12) United States Patent
Cao

(10) Patent No.: US 10,871,682 B2
(45) Date of Patent: Dec. 22, 2020

(54) METHOD FOR MANUFACTURING DISPLAY PANEL, DISPLAY PANEL AND DISPLAY DEVICE

(71) Applicants: BOE Technology Group Co., Ltd., Beijing (CN); Beijing BOE Display Technology Co., Ltd., Beijing (CN)

(72) Inventor: Wei Cao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 204 days.

(21) Appl. No.: 16/006,021

(22) Filed: Jun. 12, 2018

(65) Prior Publication Data
US 2019/0101781 A1 Apr. 4, 2019

(30) Foreign Application Priority Data
Sep. 29, 2017 (CN) .......................... 2017 1 0909879

(51) Int. Cl.
*G02F 1/1339* (2006.01)
*G03F 7/20* (2006.01)
(Continued)

(52) U.S. Cl.
CPC ........ *G02F 1/13394* (2013.01); *C01B 32/198* (2017.08); *C09K 19/56* (2013.01);
(Continued)

(58) Field of Classification Search
CPC ........... G02F 1/13394; G02F 1/133723; G02F 1/133788; G02F 2001/133796;
(Continued)

(56) References Cited

U.S. PATENT DOCUMENTS 5,739,882 A * 4/1998 Shimizu .............. G02F 1/13394
349/123
5,793,457 A * 8/1998 Tamai ............... G02F 1/133512
349/110
(Continued)

FOREIGN PATENT DOCUMENTS

CN 101398572 A 4/2009
CN 101546069 A 9/2009
(Continued)

OTHER PUBLICATIONS

First Office Action, including Search Report, for Chinese Patent Application No. 201710909879.5, dated Nov. 28, 2019, 17 pages.

*Primary Examiner* — John A McPherson
(74) *Attorney, Agent, or Firm* — Westman, Champlin & Koehler, P.A.

(57) ABSTRACT

A method for manufacturing a display panel, a display panel and a display device are provided. The method for manufacturing a display panel includes: mixing a liquid crystal material and a spacer preparation material, and injecting them between an array substrate and a color filter substrate which are assembled; performing a UV irradiation on the assembled array substrate and the color film substrate with ultraviolet rays by using a mask plate to polymerize the spacer preparation material to form spacers, the spacers connecting the array substrate and the color film substrate.

13 Claims, 2 Drawing Sheets

(51) Int. Cl.
*G02F 1/1337* (2006.01)
*C09K 19/56* (2006.01)
*C01B 32/198* (2017.01)
*G03F 7/027* (2006.01)

(52) U.S. Cl.
CPC .. *G02F 1/133723* (2013.01); *G02F 1/133788* (2013.01); *G03F 7/027* (2013.01); *G03F 7/2002* (2013.01); *G02F 2001/13398* (2013.01); *G02F 2001/133796* (2013.01); *G02F 2202/022* (2013.01); *G02F 2202/16* (2013.01)

(58) Field of Classification Search
CPC ....... G02F 2202/16; G02F 2001/13398; C01B 32/198; G03F 7/2002; G03F 7/027
USPC .......................... 430/320, 321; 349/123, 156
See application file for complete search history.

(56) References Cited

U.S. PATENT DOCUMENTS

| | | | |
|---|---|---|---|
| 9,612,483 | B2 | 4/2017 | Wang |
| 10,048,540 | B2 | 8/2018 | Li et al. |
| 2015/0131018 | A1 | 5/2015 | Jeon et al. |
| 2016/0004125 | A1* | 1/2016 | Li .......................... G03F 1/106 252/512 |
| 2016/0223848 | A1 | 8/2016 | Wang |

FOREIGN PATENT DOCUMENTS

| | | |
|---|---|---|
| CN | 103676331 A | 3/2014 |
| CN | 104536211 A | 4/2015 |
| CN | 105785667 A | 7/2016 |
| WO | 03044594 A1 | 5/2003 |

* cited by examiner mixing a liquid crystal material and a spacer preparation material, and injecting them between an array substrate and a color filter substrate which are assembled — 101 performing a UV irradiation on the assembled array substrate and the color film substrate with ultraviolet rays by using a mask plate to polymerize the spacer preparation materials to form a spacer, the spacer connecting the array substrate and the color film substrate — 102

Fig. 1

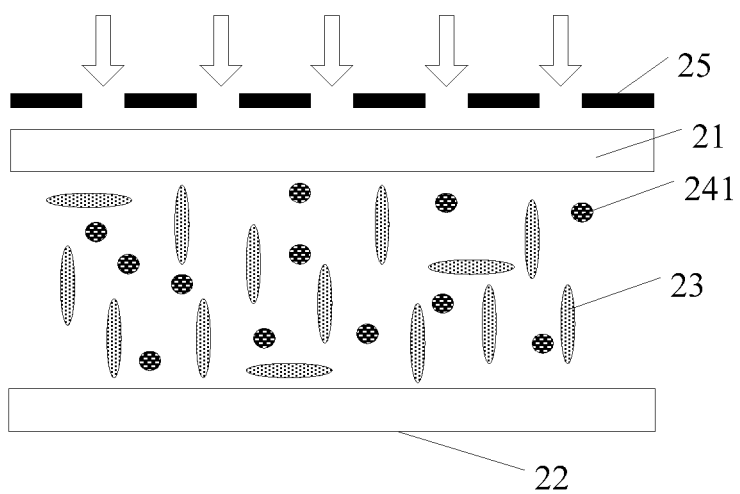

Fig. 2

METHOD FOR MANUFACTURING DISPLAY PANEL, DISPLAY PANEL AND DISPLAY DEVICE

CROSS-REFERENCE TO RELATED APPLICATION

This application claims the benefit of Chinese Patent Application No. 201710909879.5 filed on Sep. 29, 2017 in the State Intellectual Property Office of China, the whole disclosure of which is incorporated herein by reference.

BACKGROUND OF THE INVENTION

Field of the Invention

The present disclosure relates to the field of display technologies, and in particular, to a method for manufacturing a display panel, a display panel, and a display device.

Description of the Related Art

In a manufacturing method of the related art, spacers thus formed may usually be fixed only to a color filter substrate. Then, in a process of aligning and assembling the color filter substrate and an array substrate, if the spacers are subjected to an external force, the spacers slide at corresponding positions on the array substrate. On the other hand, when the assembled display panel is bent, the spacers are not fixed relative to the array substrate, which will affect the display effect.

SUMMARY OF THE INVENTION

According to an aspect of the present disclosure, there is provided a method for manufacturing a display panel, comprising:

mixing a liquid crystal material and a spacer preparation material, and injecting them between an array substrate and a color filter substrate which are assembled;

performing a UV irradiation on the assembled array substrate and the color film substrate with ultraviolet rays by using a mask plate to polymerize the spacer preparation material to form spacers, the spacers connecting the array substrate and the color film substrate.

In an embodiment, after the step of performing a UV irradiation on the assembled array substrate and the color film substrate with ultraviolet rays by using a mask plate, the method further comprises:

heat-treating the assembled array substrate and the color filter substrate irradiated by the ultraviolet.

In an embodiment, the spacer is a conductive spacer.

In an embodiment, the spacer preparation material is a polymerizable monomer doped with a conductive polymer monomer.

In an embodiment, the polymerizable monomer comprises any one of acetylene-doped acrylic acid, thiophene-doped acrylic acid, pyrrole-doped acrylic acid, and aniline-doped acrylic acid.

In an embodiment, a mass ratio of the polymerizable monomer in a mixture of the polymerizable monomer and the liquid crystal material is 5% to 10%; and a mass ratio of the conductive polymer monomer in the polymerizable monomer is 10% to 20%.

In an embodiment, the method further comprises forming a conductive alignment film on the array substrate and the color filter substrate, respectively.

In an embodiment, a material of the conductive alignment film includes a composite containing at least graphene and polyimide.

In an embodiment, the composite of graphene and polyimide is prepared by the following steps:
preparing graphene oxide,
preparing a graphene oxide-polyacrylic acid solution,
reducing the graphene oxide-polyacrylic acid solution to obtain a composite containing at least graphene and polyimide.

In an embodiment, the step of preparing graphene oxide comprises:

stirring and mixing concentrated sulfuric acid, graphite powder, $K_2S_2O_8$ (potassium persulfate), and $P_2O_5$ (diphosphorus pentoxide) to obtain a mixture, making the mixture react in a water bath at 80° C., diluting them with water, centrifugalizing a product formed by reacting and diluting, and placing the product processed by centrifugalizing into a vacuum oven and drying it therein, mixing the product processed by drying with concentrated sulfuric acid and KMnO4 (potassium permanganate) in an ice bath and stirring them, then diluting them with water, and in turn stirring them, then adding an appropriate amount of $H_2O_2$ aqueous solution (hydrogen peroxide) and centrifugalizing the product to obtain graphene oxide, removing impurities from the graphene oxide by one of washing with hydrochloric acid and water and dialysis, and performing an ultrasonic dispersion.

In an embodiment, the step of preparing a graphene oxide-polyacrylic acid solution comprises:

dissolving graphene oxide and polyacrylic acid in ultrapure water respectively, and performing an ultrasonic dispersion, and mixing the graphene oxide aqueous solution and the polyacrylic acid aqueous solution at a certain ratio and stirring them, and performing an ultrasonic treatment to obtain a uniformly dispersed graphene oxide-polyacrylic acid solution.

In an embodiment, the step of preparing a graphene oxide-polyacrylic acid solution comprises:

dissolving graphene oxide and polyacrylic acid respectively in NMP (N-methyl-2-pyrrolidone) solution, and mixing the graphene oxide NMP solution and the polyacrylic acid NMP solution at a certain ratio and stirring them at a certain temperature to obtain a graphene oxide-polyacrylic acid solution.

In an embodiment, the step of reducing the graphene oxide-polyacrylic acid solution comprises:

reducing graphene oxide in the graphene oxide-polyacrylic acid solution to graphene, and reducing polyacrylic acid in the graphene oxide-polyacrylic acid solution to polyimide, with a chemical reduction or a thermal reduction.

In an embodiment, the composite containing at least graphene and polyimide further contained unreduced polyacrylic acid.

According to an aspect of the present disclosure, there is provided a display panel comprising an array substrate and a color filter substrate which are aligned and assembled, and a spacer connected to the array substrate and the color filter substrate.

In an embodiment, the spacer is a conductive spacer.

In an embodiment, a conductive alignment film is formed on the array substrate and the color filter substrate, respectively.

In an embodiment, the material of the conductive alignment film comprises a composite containing at least graphene and polyimide.

In an embodiment, the composite containing at least graphene and polyimide further comprises unreduced polyacrylic acid.

According to an aspect of the present disclosure, there is provided a display device comprising the display panel mentioned above.

BRIEF DESCRIPTION OF THE DRAWINGS

FIG. 1 shows a flowchart of a method for manufacturing a display panel according to an embodiment of the present disclosure;

FIG. 2 shows a schematic structural view of a display panel irradiated by ultraviolet according to the present disclosure.

DETAILED DESCRIPTION OF PREFERRED EMBODIMENTS OF THE INVENTION

Figure 3:
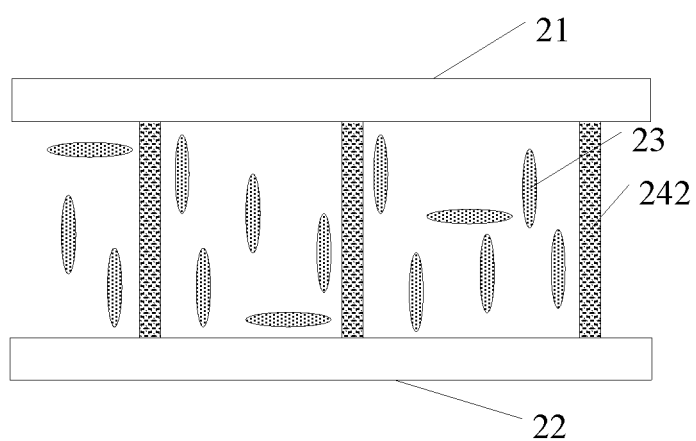
FIG. 3 shows a schematic structural view of a display panel after forming conductive spacers according to the present disclosure.

In order to make the above objects, features, and advantages of the present disclosure more comprehensible, the present disclosure will be further described in detail with reference to the accompanying drawings and specific embodiments. Referring to FIG. 1, a flowchart of a method for manufacturing a display panel according to an embodiment of the present disclosure is shown.

In step 101, mixing a liquid crystal material and a spacer preparation material, and injecting them between an array substrate and a color filter substrate which are aligned and assembled.

In the embodiment of the present disclosure, the liquid crystal material and the conductive spacer preparation material are mixed to obtain a mixture, the array substrate and the color filter substrate are aligned and assembled, and then the mixture is injected between the assembled array substrate and the color filter substrate.

The conductive spacer preparation material is a polymerizable monomer doped with a conductive polymer monomer. The polymerizable monomer includes any one of acetylene-doped acrylic acid, thiophene-doped acrylic acid, pyrrole-doped acrylic acid, and aniline-doped acrylic acid.

The acrylic polymer is doped with a conductive polymer monomer, and the conductive polymerized monomer will form a conductive polymer after being polymerized. The conductive polymer monomer may be any one of acetylene, thiophene, pyrrole and aniline. The polymerizable monomer doped with the conductive polymer monomer includes any one of acetylene-doped acrylic acid, thiophene-doped acrylic acid, pyrrole-doped acrylic acid, and aniline-doped acrylic acid.

In an embodiment of the present disclosure, a mass ratio of the polymerizable monomer in the mixture of the polymerizable monomer and the liquid crystal material is 5% to 10%; and a mass ratio of the conductive polymer monomer in the polymerizable monomer is 10% to 20%. In practical applications, the above-mentioned mass ratio may be adjusted as needed.

In the embodiment of the present disclosure, conductive films are formed on the array substrate and the color filter substrate respectively. A material of the conductive film is ITO (Indium Tin Oxide), and the ITO conductive film is used to electrically connect the array substrate and the color filter substrate, or achieves a function of storing charges. After the ITO conductive film is formed, in order to realize the alignment of the liquid crystal layer in the display panel, it is also necessary to form a liquid crystal alignment layer on the ITO conductive film by spin coating.

In another embodiment of the present disclosure, a conductive alignment film is formed on the array substrate and the color filter substrate, respectively, and a material of the conductive alignment film includes a composite containing at least graphene and polyimide. Among them, a composite containing at least graphene and polyimide is prepared by the following steps:

Firstly, a graphene oxide is prepared. Specifically, an appropriate amount of concentrated sulfuric acid, a certain amount of graphite powder, $K_2S_2O_8$ (potassium persulfate), $P_2O_5$ (diphosphorus pentoxide) and other substances are stirred and mixed to obtain a mixture of them, and after the mixture is reacted in a water bath at 80° C. for a certain time, the reactant is diluted with water and centrifugalized to separate the product formed by reacting and diluting, which then is dried in a vacuum oven; the above dried product is in turn mixed with concentrated sulphuric acid and $KMnO_4$ (potassium permanganate) in an ice bath, the mixture thus formed is further stirred for a certain period of time, and then is added with water, and in turn stirred, then is further added with a appropriate amount of water and $H_2O_2$ (Hydrogen peroxide), the product thus formed is subsequently centrifugalized to obtain graphene oxide, graphene oxide is washed with hydrochloric acid and water, or dialyzed, so as to remove impurity ions; finally, an ultrasonic dispersion is performed to obtain a graphene oxide solution.

Then, a graphene oxide-polyacrylic acid solution is prepared. Specifically, the method includes two methods as follows. In a first method, the graphene oxide and the polyacrylic acid are dissolved in ultrapure water respectively and ultrasonically dispersed; the graphene oxide aqueous solution and the polyacrylic acid aqueous solution are mixed in a certain ratio by stirring. After an ultrasound treatment, a uniformly dispersed graphene oxide-polyacrylic acid solution is obtained; a mass ratio of the graphene oxide to the ultrapure water is 1:50~1:100, a mass ratio of the polyacrylic acid to the ultrapure water is 1:50~1:100, and a mass ratio of the graphene oxide aqueous solution to the polyacrylic acid aqueous solution is 1:20~1:200. In a second method, graphene oxide and polyacrylic acid are respectively dissolved in a solution of NMP (N-methyl-2-pyrrolidone, N-methylpyrrolidone), and NMP solution of graphene oxide and NMP solution of polyacrylic acid are mixed at a certain ratio, and are stirred at a certain temperature to obtain a graphene oxide-polyacrylic acid solution; a mass ratio of the graphene oxide and the NMP solution is 1:50~1:100, a mass ratio of the polyacrylic acid to the NMP solution is 1:50~1:100, and a mass ratio of the graphene oxide NMP solution to the polyacrylic acid NMP solution is 1:20~1:200.

Next, the graphene oxide-polyacrylic acid solution is reduced to obtain a composite containing at least graphene and polyimide. Specifically, the graphene oxide-polyacrylic acid solution is chemically reduced or thermally reduced, so that the graphene oxide in the graphene oxide-polyacrylic acid solution is reduced to graphene, and at the same time, polyacrylic acid in the graphene oxide-polyacrylic acid solution is reduced to polyimide.

It should be noted that in the process of reducing polyacrylic acid to polyimide, a phenomenon of incomplete reduction of polyacrylic acid may occur. Therefore, the composite thus obtained also includes unreduced polyacrylic acid. However, the presence of polyacrylic acid does not affect the liquid crystal alignment of the composite.

In the liquid crystal alignment layer manufacturing process, a mixed type material of PI/PAA (polyimide/polyacrylic acid) is also commonly used. Therefore, in one embodiment of the present disclosure, the composite thus obtained also includes unreduced polyacrylic acid. The polyimide obtained by reduction has good alignment and stability, while the non-reduced polyacrylic acid has good adhesion, which may ensure the adhesion of the alignment layer to the glass substrate (array substrate or color film substrate).

Finally, the resulting composite containing at least graphene and polyimide is dissolved in an organic solvent (eg, γ-Hydroxypropionolactone), and then the organic solution containing the composite is coated on the array substrate and the color film substrate by a wet coating process. The coated material is finally dried to form a conductive alignment film.

By one layer of conductive alignment film, a conductive function and an alignment function can be simultaneously realized, that is, it may replace the ITO conductive film and the liquid crystal alignment layer. In the process of preparing the display panel, it is only necessary to prepare the conductive alignment film once on the array substrate and the color film substrate, which simplifies the preparation process of the display panel, reduces the production cost, and increases the production capacity.

Graphene is a planar material in which carbon atoms are hybridized by sp2 to consist hexagonal honeycomb structure; with a thickness of merely 0.336 nm, it essentially functions as a thinnest but hardest nano-material in the world, and it has a relatively high transmittance, a relatively large thermal conductivity, and a relatively high electron mobility at room temperature, while graphene also has a low resistivity, making it a material with the lowest resistivity. Therefore, since the graphene has the characteristics of an extremely low resistivity and an extremely fast electron transfer rate, the conductive property of the array substrate and the color film substrate is enhanced by replacing the ITO conductive film with graphene in the conductive alignment film.

Step 102, performing a UV irradiation on the assembled array substrate and the color film substrate with ultraviolet rays by using a mask plate to polymerize the spacer preparation materials to form spacers, the spacers connecting the array substrate and the color film substrate. The spacers may be located in corresponding regions of a pattern of the mask plate.

Referring to FIG. 2, a schematic structural view of a display panel irradiated by ultraviolet according to the present disclosure is shown.

In the embodiment of the present disclosure, after the liquid crystal material 23 and the conductive spacer preparation material 241 are mixed and injected between the array substrate 22 and the color filter substrate 21 which are aligned and assembled, the assembled array substrate 22 and the color filter substrate 21 are irradiated with ultraviolet rays using a mask plate 25.

Referring to FIG. 3, a schematic structural view of a display panel after forming conductive spacers according to the present disclosure is shown.

After the aligned and assembled, array substrate 22 and the color filter substrate 21 are irradiated with ultraviolet rays using a mask plate 25, the conductive spacer preparation material 241 is polymerized to form the conductive spacers 242, and the polymerized conductive spacers 242 may connect both the array substrate 22 and the color filter substrate 21 at the same time.

The conductive spacers are formed between the array substrate and the color film substrate, and are located in a region corresponding to a pattern of the mask plate pattern. Generally, the conductive spacers are formed in a region corresponding to an opaque region of the mask, while the liquid crystal layer is located in another region corresponding to a light-transmitting region of the mask.

It can be understood that the element indicated by 22 in FIG. 2 and FIG. 3 may also be the color filter substrate, and the element indicated by 21 may be the array substrate, which is not limited by the embodiment of the disclosure. The conductive spacers 242 in FIG. 3 only show the structural diagram of the conductive spacers. The specific position for forming the conductive spacer 242 does not correspond to the mask in FIG. 2; if being irradiated with ultraviolet rays using the mask 25 in FIG. 2, then the conductive spacers formed in FIG. 3 should include five conductive spacer components arranged at equal intervals.

In the embodiment of the present disclosure, the material for preparing the conductive spacers is a polymerizable monomer doped with a conductive polymer monomer, and after being irradiated with ultraviolet rays, a conductive spacer may be formed. The conductive polymer monomer in the conductive spacer preparation material may be polymerized to form a conductive polymer after being irradiated with ultraviolet rays. The conductive polymer monomer may be any one of acetylene, thiophene, pyrrole and aniline. When the conductive polymer monomer is acetylene, polyacetylene may be formed through polymerization. When the conductive polymer monomer is thiophene, polythiophene may be formed through polymerization. When the conductive polymer monomer is pyrrole, polypyrrole may be formed through polymerization. When the conductive polymer monomer is aniline, polyaniline can be formed by polymerization. The polymerizable monomer is doped with a conductive polymer monomer so that the polymerized spacers may achieve conductivity.

The display panel of the related art generally implements conductivity between the array substrate and the color film substrate by doping conductive metal in a sealant. The present disclosure may realize the conductivity between the substrate and the color filter substrate by replacing the conductive metal in the sealant with the conductive spacers, which makes the display panel have a more uniform conductivity. Certainly, while the conductivity between the array substrate and the color filter substrate is achieved through the conductive spacers, a frame sealant doped with a conductive metal may also be used to improve the conductivity of the display panel.

In an aspect of the flexible display panel, after the display panel is bent, the conductive spacers formed by polymerization may simultaneously connect the array substrate and the color filter substrate, so that neither an excessively strong support nor an insufficient support provided by the spacers may readily be obtained, and an alignment deviation may not be caused readily.

In the related art, a spacer may be formed on a color filter substrate through a series of processes such as photoresist coating, exposure, and development, and then the color filter substrate on which the spacers are formed is assembled with the array substrate, and then the liquid crystal material is injected after assembly. In the present disclosure, a liquid crystal material and a polymerizable monomer doped with a conductive polymer monomer are mixed and injected between the array substrate and the color filter substrate which are aligned and assembled, and the conductive spacers connecting an array substrate and a color filter are formed by ultraviolet irradiation, which simplifies the process flow, reduces the production cost, and increases the production capacity compared with the related technologies.

In an embodiment of the present disclosure, after the array substrate and the color filter substrate being assembled are irradiated with ultraviolet rays by using a mask plate, the assembled array substrate and the color filter substrate irradiated with ultraviolet rays are subjected to heat treatment, so that the conductive spacer preparation material can be completely polymerized to form the conductive spacers.

When the conductive alignment film is formed on the array substrate and the color film substrate, respectively and a material of the conductive alignment film includes a composite containing at least graphene and polyimide, since the composite containing graphene and polyimide has polar groups, and the polymerized conductive spacers and the conductive alignment film are connected by a chemical bond, so that the connection performance between the conductive spacers and the array substrate and the color filter substrate is better.

In the embodiment of the present disclosure, the liquid crystal material and the conductive spacer preparation material are mixed and injected between the array substrate and the color filter substrate which are aligned and assembled, and the assembled array substrate and the color filter substrate are subjected to ultraviolet by using a mask plate. The irradiation causes the conductive spacer preparation material to polymerize to form a conductive spacer. The conductive spacers connecting the array substrate and the color filter substrate may be formed by ultraviolet irradiation, such that a misalignment may not readily occur. In the aspect of a flexible display panel, it is not easy to cause a situation that support of the spacers is either too strong or deficient, and therefore the display effect of the display device is improved. The conductivity between the array substrate and the color filter substrate is achieved through the conductive spacers, so that the display panel has better conductivity uniformity, at the same time, the process flow is simplified, the production cost is reduced, and the production capacity is increased.

An embodiment of the present disclosure provides a display panel. As shown in FIG. 3, the display panel includes an array substrate 22 and a color filter substrate 21 which are aligned and assembled, and conductive spacers 242 formed between the array substrate 22 and the color filter substrate 21.

A conductive spacer preparation material is a polymerizable monomer doped with a conductive polymer monomer.

The polymerizable monomer includes any one of acetylene-doped acrylic acid, thiophene-doped acrylic acid, pyrrole-doped acrylic acid, and aniline-doped acrylic acid.

A mass ratio of the polymerizable monomer in the mixture of the polymerizable monomer and the liquid crystal material is 5% to 10%; a mass ratio of the conductive polymer monomer in the polymerizable monomer is 10% to 20%.

In one embodiment, a conductive alignment film is formed on the array substrate and the color filter substrate, respectively. A material of the conductive alignment film includes a composite containing at least graphene and polyimide.

The composite containing at least graphene and polyimide further contains unreduced polyacrylic acid.

The display panel in the embodiment of the present disclosure may be made using the method for manufacturing the display panel in the above embodiments.

In the embodiment of the present disclosure, the display panel includes an array substrate and a color filter substrate which are aligned and assembled, and conductive spacers formed between the assembled array substrate and the color filter substrate. The conductive spacers may be connected to both the array substrate and the color film substrate, and it is not easy to cause misalignment. In the aspect of the flexible display panel, it is not easy to cause the situation that support of the spacers is either too strong or deficient, and thus the display effect of the display device is improved. The conductivity between the array substrate and the color filter substrate is achieved through the conductive spacers, so that the display panel has better conductivity uniformity, at the same time, the process flow is simplified, the production cost is reduced, and the production capacity is increased.

The present disclosure provides a display device including a display panel of an embodiment of the present disclosure.

The display panel includes an array substrate and a color filter substrate which are aligned and assembled, and conductive spacers formed between the array substrate and the color filter substrate.

A conductive alignment film is formed on the array substrate and the color filter substrate respectively.

The display device may be any product or component that has a display function, such as a mobile phone, a tablet computer, a television, a display, a laptop computer, a navigator, and the like.

A display device of an embodiment of the present disclosure includes a display panel. The display panel includes an array substrate and a color filter substrate which are aligned and assembled, and a conductive spacer formed between the assembled array substrate and the color filter substrate. The conductive spacer may be connected to both the array substrate and the color film substrate, and it is not easy to cause misalignment. In the aspect of the flexible display panel, it is not easy to cause the situation that support of the spacer is too strong or deficient, and the display effect of the display device is improved. The conductivity between the array substrate and the color filter substrate is achieved through the conductive spacer, so that the display panel has better conductivity uniformity, at the same time, the process flow is simplified, the production cost is reduced, and the production capacity is increased.

For the foregoing method embodiments, for the sake of simple description, they are all expressed as a series of operation combinations, but those skilled in the art should understand that the disclosure is not limited by the described sequence of operations, because according to the disclosure, these steps may be performed in other orders or simultaneously. Secondly, those skilled in the art should also understand that the operations and modules involved in the embodiments described in the specification are not necessarily required by the present disclosure.

Each embodiment in this specification is described in a progressive manner, and each embodiment focuses on the differences from other embodiments, and the same or similar parts among the embodiments can be referred to each other.

Finally, it should also be noted that the terms "include", "including" or any other variations thereof are intended to cover non-exclusive inclusions such that a process, method, article or device that includes a range of elements includes not only those elements but also includes other elements that are not explicitly listed, or elements that are inherent to such processes, methods, article or device. In the case of no more limitation, an element defined by the sentence "includes a . . . " does not exclude another identical element in the process, the method, the commodity, or the device including the element.

The method for manufacturing a display panel, the display panel and the display device provided by the present disclosure have been described in detail above. Specific examples are used in the present disclosure to explain the principle and implementation manners of the present disclosure. However, the above description of the embodiment is only used to help understand the method and core idea of the present disclosure, at the same time, those skilled in the art will make modifications in the specific implementation and application range according to the idea of the present disclosure. In summary, the contents of the present specification should not be construed as limiting the present disclosure.

What is claimed is:

1. A method for manufacturing a display panel, comprising:
   mixing a liquid crystal material and a spacer preparation material, and injecting them between an array substrate and a color filter substrate which are assembled;
   performing a UV irradiation on the assembled array substrate and the color film substrate with ultraviolet rays by using a mask plate to polymerize the spacer preparation material to form spacers, the spacers connecting the array substrate and the color film substrate, wherein
   the spacer is a conductive spacer.

2. The method according to claim 1, wherein after the step of performing a UV irradiation on the assembled array substrate and the color film substrate with ultraviolet rays by using a mask plate, the method further comprises:
   heat-treating the assembled array substrate and the color filter substrate irradiated by the ultraviolet.

3. The method according to claim 1, wherein the spacer preparation material is a polymerizable monomer doped with a conductive polymer monomer.

4. The method according to claim 3, wherein the polymerizable monomer comprises any one of acetylene-doped acrylic acid, thiophene-doped acrylic acid, pyrrole-doped acrylic acid, and aniline-doped acrylic acid.

5. The method according to claim 3, wherein a mass ratio of the polymerizable monomer in a mixture of the polymerizable monomer and the liquid crystal material is 5% to 10%; and a mass ratio of the conductive polymer monomer in the polymerizable monomer is 10% to 20%.

6. The method according to claim 1, further comprising: forming a conductive alignment film on the array substrate and the color filter substrate, respectively.

7. The method according to claim 6, wherein a material of the conductive alignment film comprises a composite containing at least graphene and polyimide.

8. The method according to claim 7, wherein the composite of graphene and polyimide is prepared by the following steps:
   preparing graphene oxide,
   preparing a graphene oxide-polyacrylic acid solution,
   reducing the graphene oxide-polyacrylic acid solution to obtain a composite containing at least graphene and polyimide.

9. The method according to claim 8, wherein the step of preparing graphene oxide comprises:
   stirring and mixing concentrated sulfuric acid, graphite powder, $K_2S_2O_8$ (potassium persulfate), and $P_2O_5$ (diphosphorus pentoxide) to obtain a mixture,
   making the mixture react in a water bath at 80° C., diluting them with water, centrifugalizing a product formed by reacting and diluting, and placing the product processed by centrifugalizing into a vacuum oven and drying it therein,
   mixing the product processed by drying with concentrated sulfuric acid and KMnO4 (potassium permanganate) in an ice bath and stirring them, then diluting them with water, and in turn stirring them, then adding an appropriate amount of $H_2O_2$ aqueous solution (hydrogen peroxide) and centrifugalizing the product to obtain graphene oxide,
   removing impurities from the graphene oxide by one of washing with hydrochloric acid and water and dialysis, and
   performing an ultrasonic dispersion.

10. The method according to claim 8, wherein the step of preparing a graphene oxide-polyacrylic acid solution comprises:
    dissolving graphene oxide and polyacrylic acid in ultrapure water respectively, and performing an ultrasonic dispersion, and
    mixing the graphene oxide aqueous solution and the polyacrylic acid aqueous solution at a certain ratio and stirring them, and performing an ultrasonic treatment to obtain a uniformly dispersed graphene oxide-polyacrylic acid solution.

11. The method according to claim 8, wherein the step of preparing a graphene oxide-polyacrylic acid solution comprises:
    dissolving graphene oxide and polyacrylic acid respectively in NMP (N-methyl-2-pyrrolidone) solution, and
    mixing the graphene oxide NMP solution and the polyacrylic acid NMP solution at a certain ratio and stirring them at a certain temperature to obtain a graphene oxide-polyacrylic acid solution.

12. The method according to claim 8, wherein the step of reducing the graphene oxide-polyacrylic acid solution comprises:
    reducing graphene oxide in the graphene oxide-polyacrylic acid solution to graphene, and reducing polyacrylic acid in the graphene oxide-polyacrylic acid solution to polyimide, with a chemical reduction or a thermal reduction.

13. The method according to claim 8, wherein the composite containing at least graphene and polyimide further contained unreduced polyacrylic acid.

* * * * *